United States Patent
Nakagawa et al.

(10) Patent No.: US 6,518,730 B2
(45) Date of Patent: Feb. 11, 2003

(54) POWER SUPPLY UNIT, BATTERY ELECTRICAL APPARATUS, AND MEMORY EFFECT DETECTION METHOD

(75) Inventors: Hiroshi Nakagawa, Yamato (JP); Tomonori Nishio, Fujisawa (JP); Shigefumi Odaohhara, Yamato (JP); Noboru Tsurukawa, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/929,685

(22) Filed: Aug. 14, 2001

(65) Prior Publication Data

US 2002/0021110 A1 Feb. 21, 2002

(30) Foreign Application Priority Data

Aug. 16, 2000 (JP) .......................................... 2000-247050

(51) Int. Cl.[7] .......................... C02J 7/14; G01N 27/416
(52) U.S. Cl. ....................................... 320/136; 324/433
(58) Field of Search ................................. 320/134, 136; 324/432, 433

(56) References Cited

U.S. PATENT DOCUMENTS

| | | | | |
|---|---|---|---|---|
| 5,698,962 A | * | 12/1997 | Sakai et al. | 320/DIG. 16 |
| 5,703,469 A | * | 12/1997 | Kinoshita | 320/152 |
| 6,204,636 B1 | * | 3/2001 | Kinoshita et al. | 320/134 |
| 6,265,877 B1 | * | 7/2001 | Kimura et al. | 320/136 |

FOREIGN PATENT DOCUMENTS

JP          714613          1/1995

* cited by examiner

*Primary Examiner*—Gregory J. Toatley, Jr.
(74) *Attorney, Agent, or Firm*—Carlos Munoz-Bustamante

(57) ABSTRACT

A power supply unit includes a rechargeable battery for supplying power to a body circuit of an electrical apparatus, a current measurement circuit for measuring a currently-discharged current value, a voltage measurement circuit for measuring a currently-discharged voltage value, and a controller for detecting whether a memory effect occurs by determining whether a currently-discharged voltage value measured at a currently-discharged current value is lower than a predetermined voltage value when a detected battery capacity is equal to or less than a predetermined capacity.

21 Claims, 7 Drawing Sheets

FIG. 3

| Battery capacity | Current value | | | | | | |
|---|---|---|---|---|---|---|---|
| | -1.0A | 1.0A-1.5A | 1.5A-2.0A | 2.0A-2.5A | 2.5A-3.0A | 3.0A- | |
| 100-71% | N/A | N/A | N/A | N/A | N/A | N/A | |
| 61-70% | N/A | 8.28V | 8.20V | 8.12V | 8.04V | N/A | |
| 51-60% | N/A | 8.23V | 8.15V | 8.07V | 7.99V | N/A | |
| 41-50% | N/A | 8.18V | 8.10V | 8.02V | 7.94V | N/A | |
| 31-40% | N/A | 8.08V | 8.00V | 7.92V | 7.84V | N/A | |
| 21-30% | N/A | 7.98V | 7.90V | 7.82V | 7.74V | N/A | |
| 11-20% | N/A | 7.68V | 7.60V | 7.52V | 7.44V | N/A | |
| 10-0% | N/A | N/A | N/A | N/A | N/A | N/A | |

POWER SUPPLY UNIT, BATTERY ELECTRICAL APPARATUS, AND MEMORY EFFECT DETECTION METHOD

FIELD OF THE INVENTION

The present invention relates to secondary batteries (e.g. nickel-hydrogen and nickel-cadmium) that exhibit a memory effect and more particularly to a power supply unit for detecting a memory effect in such batteries.

BACKGROUND OF THE INVENTION

For various types of electrical apparatus such as notebook-type personal computers (notebook-type PC), Minidisks (MD), and video cameras, there is an ongoing requirement to provide an increase in battery capacity as well as providing a decrease in thickness and weight. These types of electrical apparatus use a secondary battery that can be recharged many times. Nickel-hydrogen (NiMH) or nickel-cadmium (NiCd) batteries are widely used as the secondary battery providing relatively large capacity at a relatively inexpensive price.

When the nickel-hydrogen battery or nickel-cadmium battery is incompletely charged or is discharged before the battery is completely discharged, an apparent charge capacity is decreased and a "memory effect" occurs in which the continuously operating time is decreased. It is known that the capacity of a battery exhibiting the memory effect is almost returned to the original state by repeating complete charge and discharge. Thus, even if a memory effect occurs, it is possible to recover a battery by performing complete charge and discharge. However, it is necessary to detect a memory effect before performing complete charge and discharge.

As used for BQ2060 of Texas Instruments Inc. (former Benchmark Inc.), a currently-known memory-effect detection method counts the number of times a shallow discharge is performed and when shallow discharge is detected 20 times, indicates that a memory effect has occurred. This method is the main stream at present.

Another detection method is disclosed in Japanese Published Unexamined Patent Application No. 7-14613. Specifically, a complete charge of a secondary battery such as a nickel-cadmium battery is performed and then a large-current discharge is performed only for a predetermined short time to measure the then battery voltage (V). Then, the difference (RV−V) between the measured battery voltage (V) and a previously-stored refreshed voltage (RV) of a battery is compared with a predetermined voltage and when the difference is equal to or higher than the predetermined voltage, it is determined that a memory effect has occurred.

However, because the above method which is the main stream at present counts the number of incomplete discharges, a problem occurs that it is assumed that a memory effect occurs even if the memory effect does not actually occur or a memory effect cannot be detected though the memory effect occurs. Moreover, even if a memory effect occurs, when the battery is perfectly discharged, data for the total capacity of the battery is learned (updated). Therefore, a difference is produced between capacity data and actual capacity and this causes a capacity-data error.

Furthermore, the art disclosed in Japanese Published Unexamined Patent Application No. 7-14613 detects a memory effect by performing large-current discharge. In general, however, at a portion having a large capacity, a clear difference does not appear between initial characteristic and a characteristic when falling into a memory effect. Therefore, erroneous detection may occur. Moreover, to circulate a large current, it is necessary to use an exclusive circuit. When setting the exclusive circuit for an information terminal unit such as a notebook-type personal computer or a general electrical apparatus, the cost for setting the exclusive circuit becomes extremely high and therefore, it is not realistic to use this art.

The present invention seeks to solve the above problems and to more accurately detect occurrence of a memory effect while performing normal operation. The result can be communicated to a user, and the memory effect removed in accordance with a user request.

SUMMARY OF THE INVENTION

The present invention determines that a memory effect occurs when it is detected that a measured battery voltage is lower than an expected voltage value for a particular measured discharged current value. That is, a power supply unit to which the present invention is applied includes: a secondary battery for supplying power to the body circuit; a current measurement circuit for measuring a currently-discharged current value; a voltage measurement circuit for measuring a currently-discharged voltage value; and determination means for determining whether the currently-discharged voltage value measured for the currently-discharged current value measured when a detected battery capacity is equal to or less than a predetermined value is lower than a predetermined value. In this case, because the determination means compares whether a detected battery capacity is lower than a predetermined value with table information stored in a memory in accordance with a voltage value to a current value when the capacity of a secondary battery is equal to or lower than a predetermined value when the capacity of the secondary battery is not sufficient and determines that a memory effect occurs when the detected battery capacity is lower than the predetermined value, the determination means is preferable from the viewpoint that it is possible to more accurately determine whether a memory effect occurs.

Moreover, notification means notifies a user that a memory effect occurs when it is determined that the memory effect occurs. As a result, when the user requests removal of the memory effect, discharge from a secondary battery is continued.

Furthermore, an AC adapter for charging a secondary battery and supplying power to the body circuit is used. Therefore, when removing a memory effect, the supply of power from the AC adapter to the body circuit is stopped and discharge from the secondary battery is performed. When it is not desired to remove the memory effect, power is supplied from the AC adapter to the body circuit. According to these aspects of the present invention, a user can detect that a memory effect occurs. Therefore, it is possible to bring performance of a battery to its maximum through conditioning.

From another viewpoint, a power supply unit to which the present invention is applied includes: an AC adapter for supplying power to the body circuit from the AC adapter; a secondary battery which is charged by an output from the AC adapter and supplies power to the body circuit; memory-effect determination means for determining whether a memory effect occurs in accordance with a current value measured by a current measurement circuit and a voltage value measured by a voltage measurement circuit; and a stop circuit for the power to be supplied from the AC adapter to the body circuit when it is determined by the memory-effect determination means that a memory effect occurs and the memory effect is removed in accordance with the designation of a user.

In this case, the memory-effect determination means has storage means for storing a predetermined value at which it is determined that a memory effect occurs in accordance with the relation between current and voltage values, compares current and voltage values to be measured with the predetermined value stored in the storage means and determines whether a memory effect occurs. Moreover, the storage means stores different predetermined values according to a temperature condition in accordance with the relation between current and voltage values. Therefore, the storage means is preferable because the means can properly obtain and determine a memory-effect occurrence state depending on a temperature condition. For example, the storage means stores a specific voltage value to a range of discharged current values divided and classified in a predetermined range while a battery capacity ranges between 70% and 10% as table information.

Moreover, the present invention uses a secondary battery such as a nickel-hydrogen battery or nickel-cadmium battery for supplying power to an electrical apparatus by repeating charge and discharge, which includes: voltage measurement means for measuring a currently-discharged voltage value; current measurement means for measuring a currently-discharged current value; battery-capacity detection means for detecting a battery capacity; and determination means for determining whether a memory effect occurs in accordance with the relation between current and voltage values to the battery capacity, the detected battery capacity, and measured voltage and current values. Furthermore, because the secondary battery has notification means for outputting a predetermined notice to an electrical apparatus such as a notebook-type PC when it is determined by determination means that a memory effect occurs, the battery is superior in that it is possible to communicate an automatically-detected memory effect to a user. The notification means uses indication on a display or voice indication.

Moreover, the determination means determines whether a memory effect occurs when a predetermined time passes, for example, approx. 5 min passes after starting discharge. Because a battery voltage generally tends to stay high right after use of a battery is started, it is possible to more accurately determine whether a memory effect occurs by removing the above condition.

Furthermore, the determination means determines whether a memory effect occurs in accordance with the relation between current and voltage values when a battery capacity is smaller than a predetermined value. Therefore, the means is preferable because it is possible to include a characteristic in which how a battery voltage lowers is changed depending on a battery capacity.

As may be used in an electrical apparatus such as a notebook-type PC, the present invention includes: an AC adapter for supplying power to the body from an AC power supply; a secondary battery which is charged by the power supplied from the AC adapter and supplies power to the body through discharge; a current measurement circuit for measuring a current value currently discharged from the secondary battery; a voltage measurement circuit for measuring a currently-discharged voltage value; a memory for storing a specific voltage value previously decided for a predetermined current value as table information or numerical information; a controller for comparing a current value measured by the current measurement circuit with a specific voltage value in which a voltage value measured while relating the current value to a predetermined current value in the memory; and a stop circuit capable of stopping the supply of power from the AC adapter.

In this case, notification means for notifying a user about a state in which it is determined that the voltage value compared by the controller is lower than the specific voltage value and input acceptance means for accepting an input showing improvement of the state to a notice of the notification means are further included and the stop circuit stops the supply of power from the AC adapter in accordance with the input accepted by the input acceptance means. Therefore, a user can operate the electrical apparatus by the AC adapter and immediately remove a memory effect by continuously using the secondary battery.

Moreover, from another viewpoint, an electrical apparatus to which the present invention is applied has an AC adapter for supplying power to the body from an AC power supply, a secondary battery for supplying power to the body through discharge, a stop circuit for stopping the supply of power from the AC adapter, and a controller for controlling the stop circuit, in which the secondary battery has a current measurement circuit for measuring a currently-discharged current value and a voltage measurement circuit for measuring a voltage value and outputs measured current and voltage values to the controller and the controller determines whether a memory effect occurs in accordance with output current and voltage values.

Furthermore, the controller has a table showing the relation between current and voltage values corresponding to a battery capacity and determines whether a memory effect occurs in accordance with values stored in the table, a battery capacity obtained by accumulating the circulating current, and current and voltage values output from measurement circuits.

Furthermore, in the case of an electrical apparatus to which the present invention is applied, a secondary battery determines whether a memory effect occurs in accordance with current and voltage values measured in the battery and when a memory effect occurs, directly notifies a controller that the memory effect occurs. The above configuration is superior in that when voltage values which appear depending on the type of a cell of a secondary battery are changed, it is possible to determine whether a memory effect occurs in the secondary battery and it is unnecessary to recognize a difference between criteria due to suppliers of batteries.

Furthermore, an electrical apparatus to which the present invention is applied comprises:

a first power-supply line for supplying power from an AC adapter connected to an AC power supply; a second power-supply line for supplying power from a secondary battery to be charged and discharged; a current measurement circuit for measuring a current value currently discharged through the second power-supply line; a voltage measurement circuit for measuring a voltage value currently discharged through the second power-supply line; a controller for determining whether a memory effect occurs in accordance with measured current and voltage values; and a stop circuit for stopping the power supplied through the first power-supply line when it is determined that a memory effect occurs and the memory effect is removed.

Furthermore, the present invention is a memory-effect detection method for detecting the memory effect of a secondary battery for supplying power to the body by performing charge and discharge, which comprises the steps of detecting the capacity of the secondary battery, measuring current and voltage values discharged from the secondary battery, and detecting whether a memory effect occurs in accordance with the relation between the measured current and voltage values under the detected battery capacity.

Furthermore, it is possible to decide a reference voltage value serving as a criterion of a voltage value to a predetermined current value under a predetermined battery capacity, compare a measured voltage value with a reference voltage value, and detect whether a memory effect occurs.

Furthermore, the predetermined battery capacity is kept in a state of 70% or less when assuming the full state as 100%. The value of 70% is obtained as a result of checking states of memory effects occurring in various secondary batteries through experiments. Therefore, not the full state but the state of 70% or less is preferable because a memory effect can be determined in accordance with a condition in which the memory effect easily appears.

Furthermore, whether a memory effect occurs is determined in accordance with a state in which fluctuation of current consumption is small by disabling a power management function that is a function of a notebook-type PC or by excluding the case in which an apparatus body accesses an HDD or CD-ROM. Therefore, this is superior in that erroneous recognition is eliminated that a memory effect occurs though there is no memory effect.

Preferred embodiments of the present invention will be described below in detail in accordance with the embodiment shown in the accompanying drawings.

BRIEF DESCRIPTION OF THE DRAWINGS

FIG. 3 is a diagram showing an example of the memory-effect detection table;

DETAILED DESCRIPTION OF THE PREFERRED EMBODIMENTS

Before starting detailed description of an apparatus to which this embodiment is applied, a study on measured data of discharge characteristics by the present inventors is described below.

Figure 7:
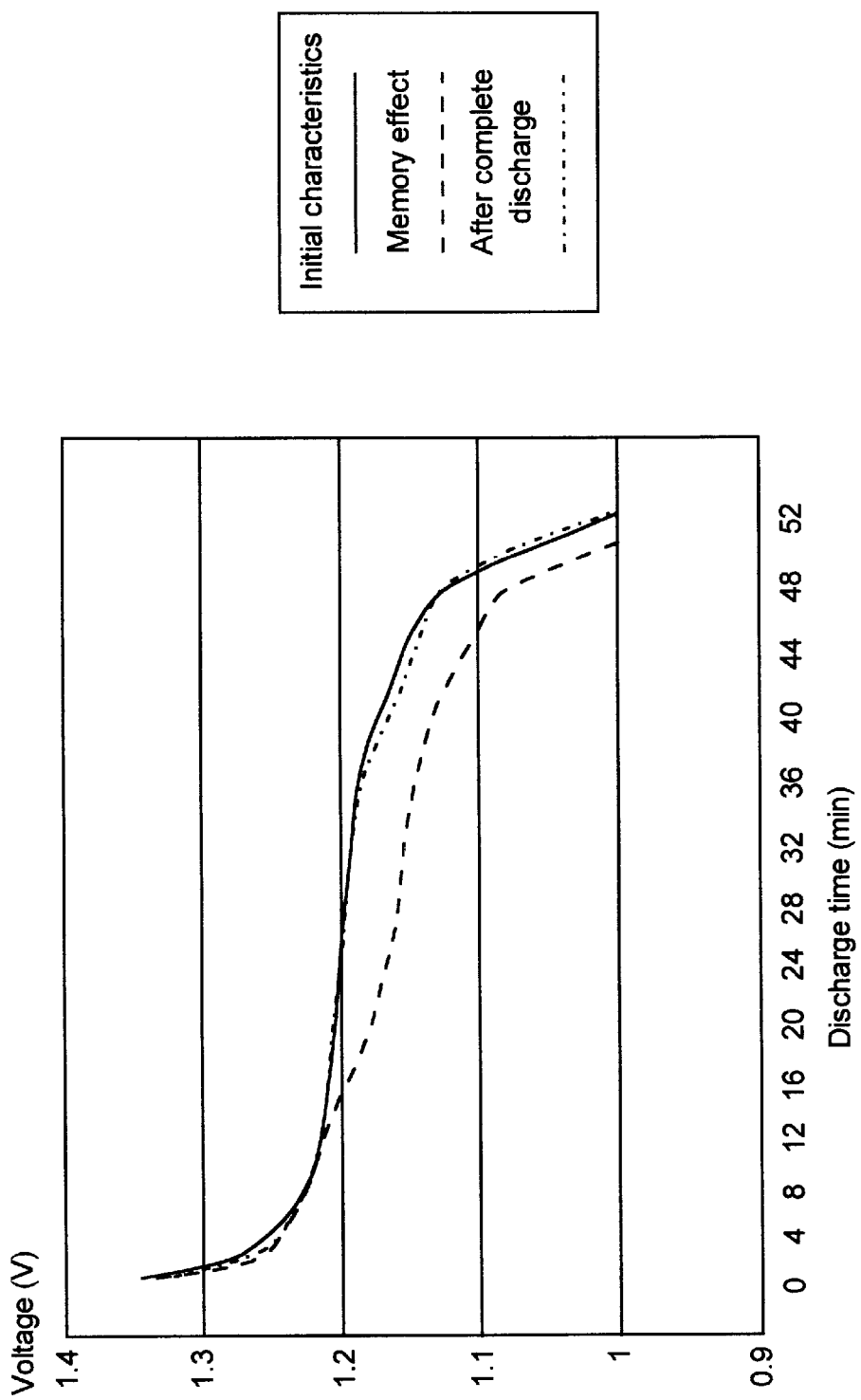
FIG. 7 is an illustration showing discharge characteristics of a nickel-hydrogen battery.

FIG. 7 is an illustration showing discharge characteristics of a nickel-hydrogen battery. The x-axis shown in FIG. 7 denotes discharge time (min) and y-axis denotes voltage (V). The measured data of the discharge characteristic of a battery falling into a memory effect in the initial state is shown by a continuous line, that of the discharge characteristic of a battery falling into a memory effect is shown by a broken line, and that of the discharge characteristic of a battery falling into a memory effect after being fully discharged is shown by an alternate long and short dash line. The battery uses a single-cell nickel-hydrogen battery and has a capacity of 2.0 Ah. As conditions at the time of causing a memory effect, the charge operation of charging the battery at a current value of 2.0 A and stopping the charge ($-\Delta V=10$ mV) when detecting a voltage drop of 10 mV and the discharge operation of discharging the battery at 2.0 A and stopping the discharge when the voltage reaches 1.2 V (nominal voltage) are repeated 20 times. The characteristic after full discharge (alternate long and short dash line) is the first-time discharge characteristic immediately after fully discharging the battery subject to a memory effect and then charging the battery. The following can be understood from FIG. 7:

The battery subject to a memory effect has a low nominal voltage value compared to the case of the normal discharge characteristic.

At the time of fully discharging the battery subject to a memory effect once, the characteristic returns to the original state (i.e. the memory effect can be removed).

According to the above results, this embodiment is constituted so as to determine that a memory effect occurs at the time of measuring the voltage of a currently-discharged battery and detecting that the battery voltage is too low to a discharged current value. Moreover, this embodiment is constituted so as to make it possible to fully discharge a battery and remove a memory effect in accordance with the designation of a user.

Figure 1:
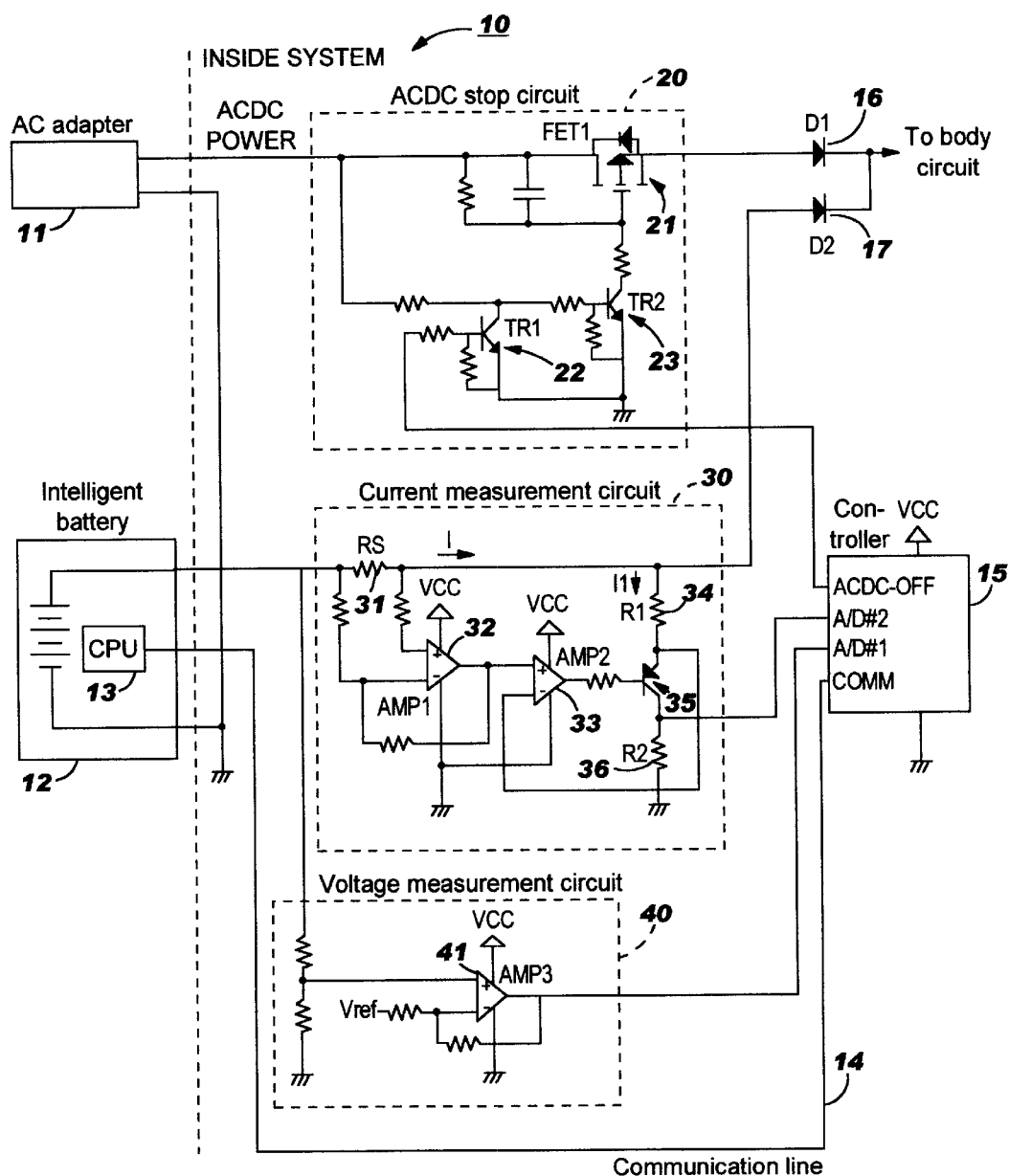
FIG. 1 is an illustrative circuit configuration of a power supply unit to which the present invention is applied.

A first embodiment will now be described with reference to FIG. 1 which shows a circuit configuration of a power supply unit to which this embodiment is applied. The power supply unit is connected to an information terminal unit such as a notebook-type personal computer (notebook-type PC) or a general electrical apparatus to supply power to the information terminal unit or the electrical apparatus. This embodiment comprises an AC adapter 11 for supplying 16 VDC from an AC power supply and an intelligent battery 12 constituted of a nickel-hydrogen battery serving as a secondary battery and having a CPU 13 and supplies power to an internal system 10 from these power supplies. The internal system 10 has an AC/DC stop circuit 20, a current measurement circuit 30, a voltage measurement circuit 40, a controller (Embedded Controller) 15 for executing the processing according to recognition of a memory effect, a first diode (D1) 16 and a second diode (D2) 17 for preventing the power supply from the AC adapter 11 from colliding with the power supply from the intelligent battery 12. Moreover, various pieces of information are communicated from the intelligent battery 12 to the controller 15 through a communication line 14.

This AC/DC stop circuit 20 has a function for stopping the power supplied from the AC adapter 11. In the internal system 10, power is supplied to the body circuit from either the AC adapter 11 or intelligent battery 12 serving as a secondary battery having a higher voltage by the first diode 16 and second diode 17. Because the voltage value of the AC adapter 11 is generally higher than that of the intelligent battery 12, power is supplied to the body circuit from the AC adapter 11 via the first diode 16. In the case of this embodiment, if a memory effect occurs in the intelligent battery 12 serving as a secondary battery, power supply from the connected AC adapter 11 is stopped by the AC/DC stop circuit 20 to realize full discharge of the intelligent battery 12.

To execute a full discharge of the intelligent battery 12 serving as a secondary battery, a high (High) signal is supplied to the AC/DC stop circuit 20 from the controller 15. A first transistor (TR1) 22 of the AC/DC stop circuit 20 is turned on by receiving the high signal. When he first transistor 22 is turned on, a second transistor (TR2) 23 is turned off and a switching FET (FET1) 21 is turned off. Thereby, supply from the AC adapter 11 is stopped, supply of power to the first diode 16 is stopped, and power can be supplied to the body circuit from the intelligent battery 12 via the second diode 17.

The current measurement circuit 30 makes it possible to obtain a current value discharged from the intelligent battery 12 serving as a secondary battery. First, a voltage I×RS is generated at the both ends of a resistor (RS) 31 by a current I supplied from the intelligent battery 12. This voltage is differentially amplified by an operational amplifier (AMPL) 32. Moreover, a current I1 proportional to an output voltage of the operational amplifier (AMP1) 32 is circulated through a resistor (R1) 34 by an operational amplifier (AMP2) 33 and a transistor 35. Finally, it is possible to convert the current I of the intelligent battery 12 to a voltage I1×R2 generated in a resistor (R2) 36. By receiving the voltage (I1×R2) at an A/D#2 port of the controller 15 and A/D-converting the voltage in the controller 15, it is possible to obtain a current value discharged from the intelligent battery 12.

Moreover, the voltage measurement circuit 40 makes it possible to obtain a voltage of the intelligent battery 12. That is, the voltage of the intelligent battery 12 is differentially amplified by an operational amplifier (AMP3) 41 and converted to a low voltage and then, supplied to an AND#1 port of the controller 15. The controller 15 can obtain the voltage of the intelligent battery 12 by AND-converting the received voltage. The configuration shown in FIG. 1 allows battery current and voltage to be measured by the internal system 10. Therefore, the configuration in FIG. 1 serves as a circuit effective also when using a dumb battery not including a CPU instead of the intelligent battery 12.

A memory-effect detection and memory-effect removing process will be described below with reference to FIG. 2 in accordance with a current value obtained from the current measurement circuit 30 and a voltage value obtained from the voltage measurement circuit 40.

After starting operation of the intelligent battery 12 (step 101), it is determined whether a predetermined time passes after start of operation of the battery (step 102). Because the battery voltage stays high right after start of operation of the battery, it is impossible to fetch an accurate value. Therefore, it is preferable to wait for 5 min or more after start of operation of the battery. After the predetermined time passes, a current value and a voltage value to be discharged are measured by the current measurement circuit 30 and voltage measurement circuit 40 (step 103). It is determined whether the measured voltage value is equal to or smaller than the value in a table (memory-effect detection table) to be described later by referring to the table in accordance with the measured current and voltage values (step 105).

FIG. 3 is a diagram showing an example of the memory-effect detection table described for step 105. A battery pack used for a notebook-type PC is constituted of a plurality of cells and a table for series configuration of a nickel-hydrogen battery 7 is shown in FIG. 3. This table is used as indices showing whether a currently-discharged battery voltage is extremely lower than a discharged current and is used inside of the controller 15 shown in FIG. 1. When it is determined by the intelligent battery 12 whether a memory effect occurs, the table is set in the intelligent battery 12. The table shown in FIG. 3 is constituted by considering phenomena in several memory effects. These phenomena include <1> how a battery voltage is lowered depends on a battery capacity, <2> a memory effect does not appear when a battery capacity is full (100%) but it appears from a battery capacity of approx. 70%, and <3> the way of appearing as a difference between battery voltages differs depending on a discharged current, that is, because a battery has a self impedance, the battery voltage is lowered due to the self impedance when a discharged current increases.

By considering the above memory-effect phenomena, the table in FIG. 3 is constituted so that 8-stage battery capacities correspond to 6-stage current values. That is, as a result of examining various charge and discharge patterns, there is an area in which a memory effect does not appear depending on a battery capacity. Therefore, the table in FIG. 3 is constituted so that battery capacities can be compared with current values as parameters. That is, at the time of assuming a full battery capacity as 100%, checking is not performed (N/A) when the capacity is larger than 71% and a specific voltage value is set as a threshold value for a predetermined current value (range of current values) in a range of 70% to 11%. By using the table and thereby reading the space of a battery capacity of 41 to 50% and the space of a current value of 1.5 to 2.0 A when a battery capacity is equal to 50% and a current value is equal to 1.8 A, it is possible to determine that a memory effect occurs if a voltage shows 8.10 V or lower (refer to the hatched area in FIG. 3). The battery capacity used in this case can be calculated by accumulating circulating current values in the case of the intelligent battery 12 having the CPU 13. In the case of a dumb battery having no microcomputer, however, it is possible to check a battery capacity by checking and accumulating outputs and inputs of currents by the controller 15 of the body.

The table shown in FIG. 3 shows an example at room temperature (25° C.). However, because a memory effect is dependent on temperature, it is also possible to form a structure so as to optimize values of the table according to temperatures (e.g. 60° C., 40° C., 25° C., and 0° C.). For example, by setting a temperature sensor to the outside or inside of a controller so as to select a proper table out of a plurality of tables generated by considering temperature conditions in accordance with a detected temperature, it is possible to more accurately detect a memory effect including the temperature conditions.

Figure 2:
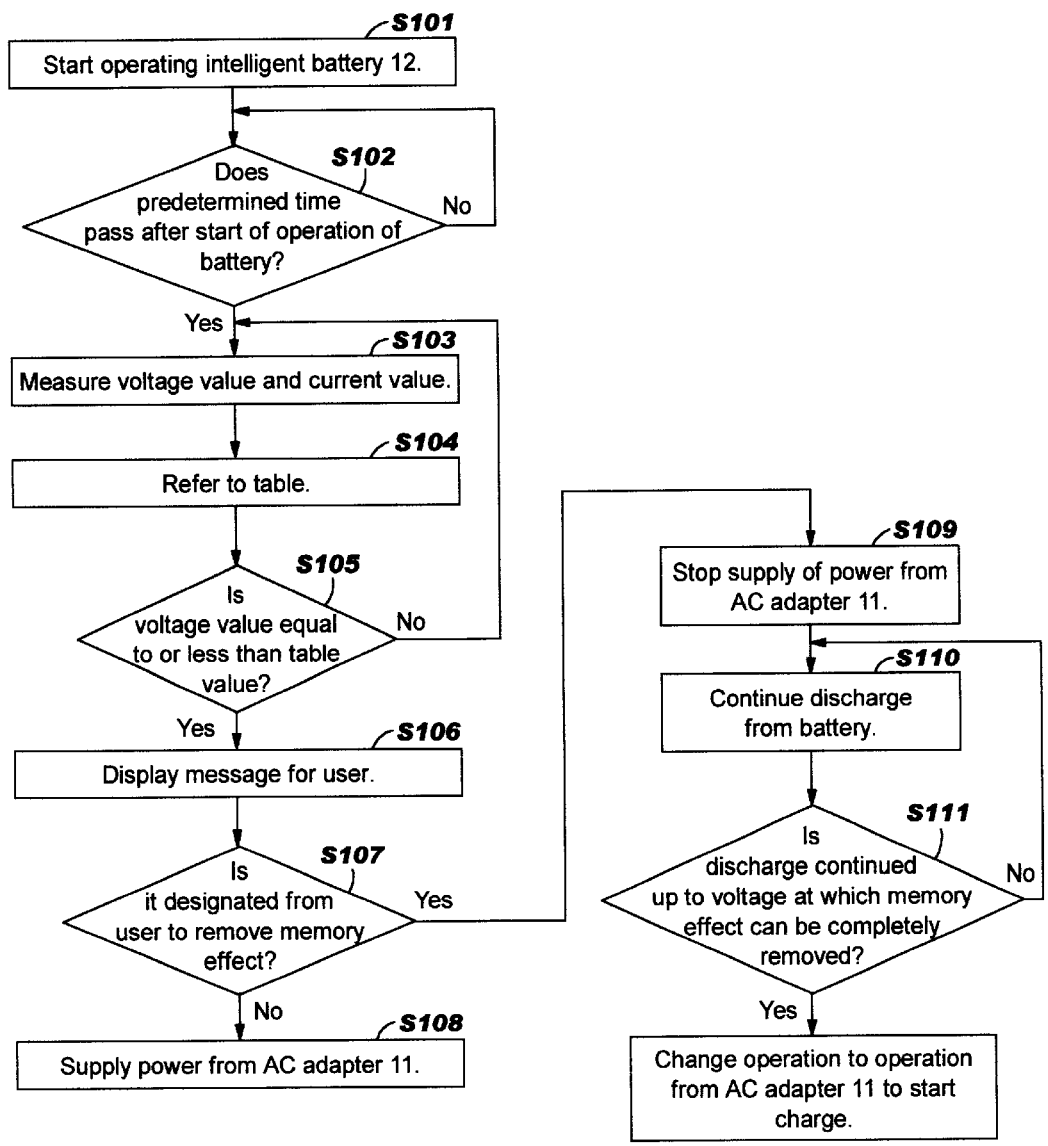
FIG. 2 is a flowchart showing a flow of processing by the present embodiment.

Thus, in step 105 shown in FIG. 2, it is determined whether a measured voltage value is equal to or less than the value in a table or less. When the current value is not equal to or less than the value in the table, step 103 is restarted to measure voltage and current values. In step 105, when the current value is less than the value in the table, it is determined that a memory effect occurs and a message is displayed for a user (step 106).

Figure 4:
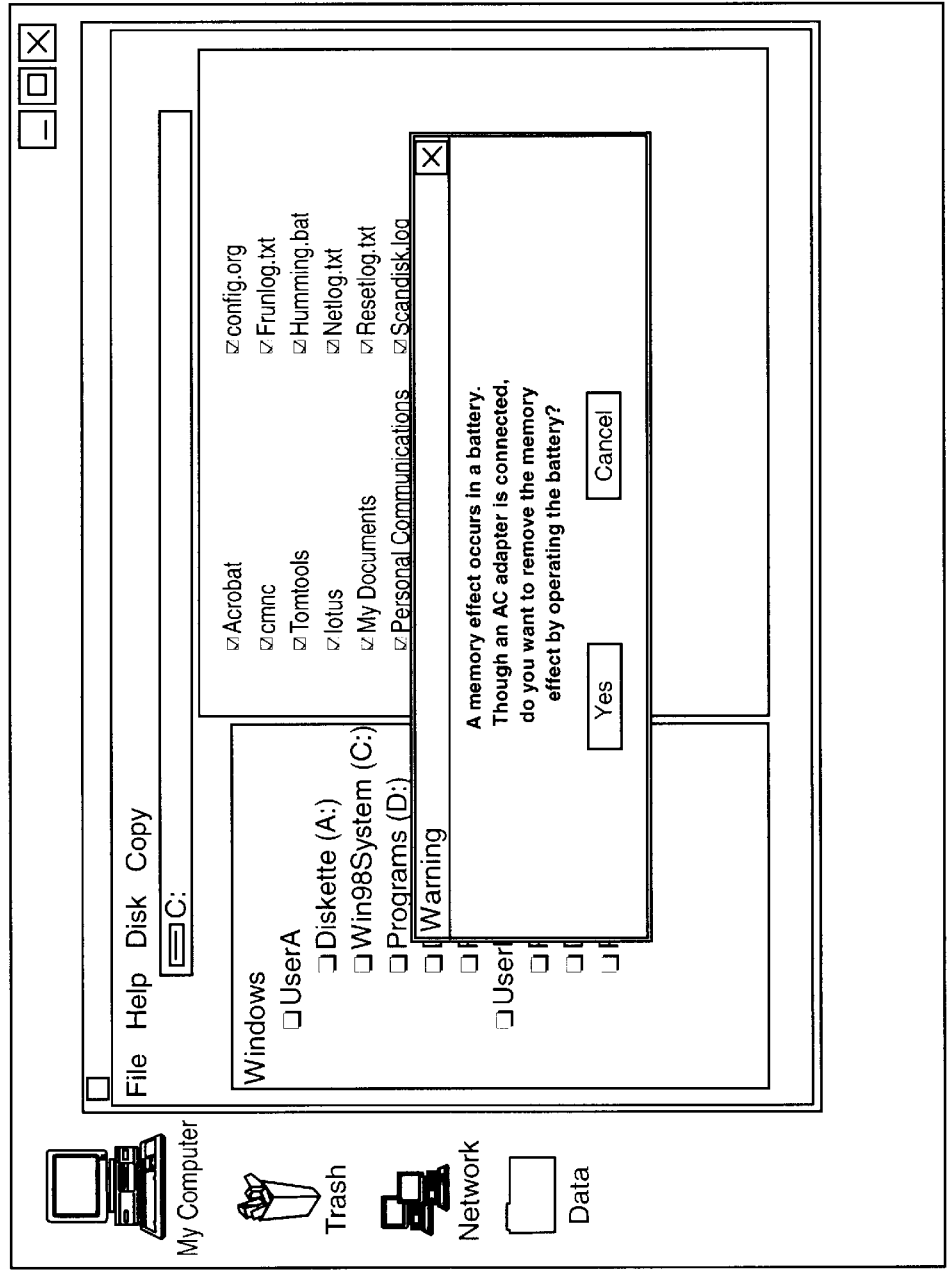
FIG. 4 is an illustration showing display examples for a user.

FIG. 4 is an illustration showing a display example for a user in step 106. In this case, when a memory effect occurs in the intelligent battery 12 and the AC adapter 11 is connected, messages "A memory effect occurs in a battery. Though an AC adapter is connected, do you want to remove the memory effect by operating the battery" are output. That is, it is asked whether to immediately supply power from the AC adapter 11 or whether to remove the memory effect by continuing discharge from the intelligent battery 12. By displaying the messages shown in FIG. 4, it is possible to communicate an automatically-detected memory effect to a user. Moreover, the user can operate a unit by the AC adapter 11 according to necessity or immediately remove a memory effect by continuously operating the intelligent battery 12. That is, it is determined whether it is designated to remove the memory effect from the user for the display in step 106 shown in FIG. 2 (step 107). When it is designated that it is unnecessary to remove the memory effect, power is supplied from the AC adapter 11 (step 108) to charge the intelligent battery 12.

On the other hand, when it is designated to remove the memory effect in step 107, supply of power from the AC adapter 11 is stopped by the AC/DC stop circuit 20 (step 109) to continue discharge from the intelligent battery 12 (step 110). Thereafter, it is determined whether discharge is continued up to a voltage by which the memory effect can be completely removed (step 111). When discharge is not completely performed, discharge is still continued. After discharge is completely performed, operations are changed to the operation by the AC adapter 11 to start charging the intelligent battery 12 (step 112). Thus, the intelligent battery 12 is completely discharged. However, because a capacity error becomes larger, learning (renewal) of the total capacity of the battery is not performed.

According to the above processing, it is possible to automatically detect a memory effect of the intelligent battery 12 and communicate the detection result to the user. Moreover, the user can operate a unit by using the AC adapter 11 according to necessity or immediately remove the memory effect by continuously operating the battery. Thus, it is possible to bring out performances of the battery at its maximum in accordance with a request of the user.

The current of the intelligent battery 12 or the like depends on an operation of a unit. Therefore, a trouble may occur that a low voltage value is detected because a large current instantaneously flows accidentally. In this case, it may be erroneously recognized that a memory effect occurs even though the memory effect does not occur. To prevent the above trouble, it is effective to turn off the power management function of a unit or decrease the fluctuation of current consumption at the time of only measuring current and voltage values of a battery. Particularly, it is preferable to turn off the stop clock function or throttling function used for a notebook-type PC only for measurement. Moreover, because the fluctuation of current consumption increases while a unit body accesses an HDD or CD-ROM, it is better to make a current value or voltage value obtained in the above period invalid. Moreover, by averaging obtained current or voltage values in a predetermined period, detection can be performed by decreasing influences of a factor other than a memory effect such as fluctuation of current consumption. For the first embodiment, a configuration is described in which the current measurement circuit 30 and voltage measurement circuit 40 are set to the internal system 10. However, a second embodiment is characterized by setting these functions to the battery side.

The same configuration as the first embodiment is provided with the same symbol and its detailed description is omitted.

Figure 5:
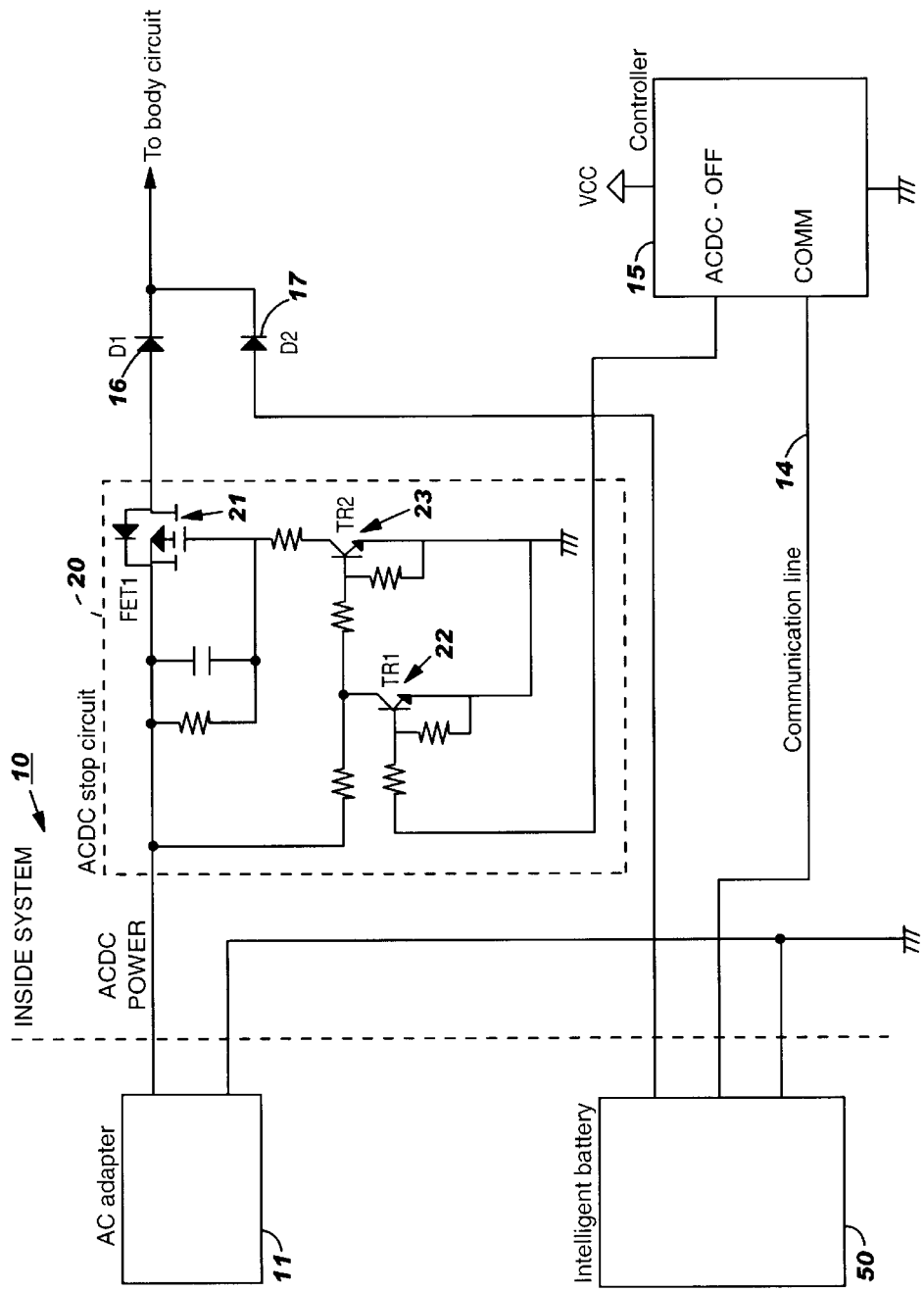
FIG. 5 is a circuit configuration of a power supply unit of an alternative embodiment.

FIG. 5 is an illustration for explaining a circuit configuration of a power supply unit of the embodiment 2. In the case of the second embodiment, an AC/DC stop circuit 20 is set in an internal system 10 to stop power in accordance with a designation from a controller 15 similarly to the case of the first embodiment. However, it is determined by an intelligent battery 50 whether a memory effect occurs and the fact that a memory effect occurs is communicated to the controller 15 from the intelligent battery 50 through a communication line 14. In this case, an intelligent battery 50 same as the table shown in FIG. 3 is provided to the intelligent battery 50 and whether a memory effect occurs is also determined by the intelligent battery 50. However, it is also possible to form a structure so that while the table described for FIG. 3 is provided to the controller 15 similarly to the case of the embodiment 1, measured battery voltage and current are transmitted from the intelligent battery 50 through the communication line 14 serving as a communication function and the determination that a memory effect occurs is executed by the controller 15.

Figure 6:
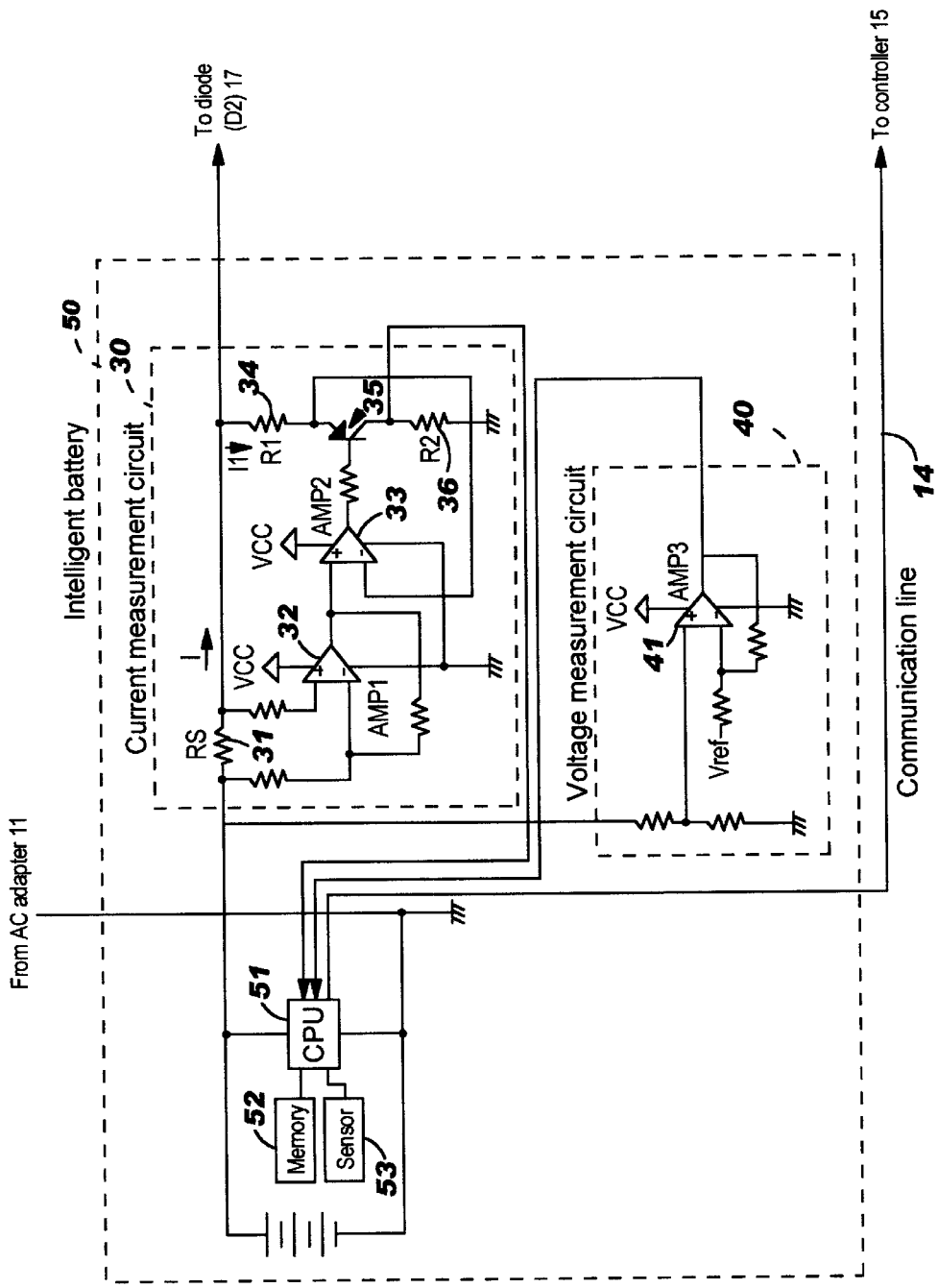
FIG. 6 is a circuit configuration of the intelligent battery of FIG. 5.

FIG. 6 is an illustration for explaining a circuit configuration of the intelligent battery 50. The intelligent battery 50 has a CPU 51, a memory 52 provided with table information, and a sensor 53 for detecting a temperature. Moreover, the current measurement circuit 30 and the voltage measurement circuit 40 are the same as those shown in FIG. 1 but their detailed descriptions are omitted. However, though output results of the current measurement circuit 30 and voltage measurement circuit 40 are output to the controller 15 in FIG. 1, they are output to the CPU 51 in the case of the circuit configuration shown in FIG. 6.

First, the value of a current I of the current measurement circuit 30 is converted to a voltage I1×R2 generated in a resistor (R2) 36 and output to the CPU 51. And the voltage converted by an operational amplifier (AMP3) 41 of the voltage measurement circuit 40 is output to the CPU 51. The CPU 51 A/D-converts the outputs from the current measurement circuit 30 and voltage measurement circuit 40 to obtain values of a discharged current and a battery voltage. Moreover, the memory 52 has the table shown in FIG. 3 optimized by a temperature (has a plurality of tables depending on temperatures). The CPU 51 selects an optimized table from the memory 52 in accordance with a temperature detected by the sensor 53 and determines whether a memory effect occurs in accordance with obtained discharged current value, battery voltage value, and battery capacity similarly to the case of the processing shown in FIG. 2. When the CPU 51 determines that a memory effect occurs, it communicates the information showing that the memory effect occurs to the controller 15 through the communication line 14 by using a communication function. The controller 15 makes it possible to communicate the information to a user and execute subsequent processing similarly to the case of the embodiment 1.

Thus, the embodiment 2 is superior in correspondence to a maker and the type of battery in addition to advantages of the embodiment 1. That is, criteria (current value and voltage value) for determining whether a memory effect occurs depend on makers for manufacturing batteries or types of batteries. However, by providing a function for determining whether a memory effect occurs for the intelligent battery 50 serving as a battery pack, it is unnecessary to provide a table for the controller 15 so as to be able to correspond to every battery pack. In other words, it is possible to increase the versatility for selecting the intelligent battery 50 serving as a battery pack.

As described above, according to the present invention, at the time of measuring a currently-discharged battery voltage and detecting that the battery voltage is too low to a discharged current value, it is determined that a memory effect occurs. Thereby, it is possible to more accurately detect that a memory effect occurs while performing the normal operation.

What is claimed is:

1. A power supply unit, comprising:
    a rechargeable battery for supplying power to a body circuit;
    a current measurement circuit for measuring a current value discharged from the battery;

a voltage measurement circuit for measuring a voltage value of the battery;

and a determination unit for determining the occurrence of a memory effect by determining whether a voltage value measured by the voltage measurement circuit is lower than a predetermined voltage value associated with the current value measured by the current measurement circuit.

2. The power supply unit according to claim 1, wherein the determination unit determines that a memory effect has occurred when the capacity of the battery is lower than a predetermined value in accordance with the voltage value for the current value.

3. The power supply unit according to claim 2, further comprising a notification unit for notifying a user of the occurrence of a memory effect, wherein in response to a designation by the user to remove the memory effect, discharge from the battery is continued.

4. The power supply unit according to claim 2, further comprising an AC adapter for charging the battery and supplying power to the body circuit, wherein when it is desired to remove the memory effect, supply of power from the AC adapter to the body circuit is stopped and discharge from the battery is performed, but when it is not desired to remove the memory effect, power is supplied from the AC adapter to the body circuit.

5. A power supply unit, comprising:

an AC adapter for supplying power to a body circuit from an AC power supply;

a rechargeable battery which is charged by an output from the AC adapter and supplies power to the body circuit;

a current measurement circuit for measuring a current value discharged from the battery;

a voltage measurement circuit for measuring a voltage value of the battery;

a memory-effect determination unit for determining the occurrence of a memory effect on the basis of the voltage value measured by the voltage measurement circuit and the current value measured by the current measurement circuit; and a stop circuit for stopping the power supplied from the AC adapter to the body circuit on a determination of the occurrence of a memory effect.

6. The power supply unit according to claim 5, wherein the memory-effect determination unit is provided with a storage unit for storing a predetermined value showing that a memory effect occurs in accordance with the relation between current and voltage values and determines whether a memory effect occurs by comparing a current value measured by the current measurement circuit and a voltage value measured by the voltage measurement circuit with the predetermined value stored in the storage unit.

7. The power supply unit according to claim 6, wherein the storage unit stores different predetermined values according to a temperature condition in accordance with the relation between current and voltage values.

8. A rechargeable battery for supplying power to an electrical apparatus, comprising:

a voltage measurement unit for measuring a currently-discharged voltage value;

a current measurement unit for measuring a currently-discharged current value;

a battery-capacity detection unit for detecting a battery capacity;

and a determination unit for determining whether a memory effect occurs in accordance with the relation between a battery capacity detected by the battery-capacity detection unit, a voltage value measured by the voltage measurement unit and a current value measured by the current measurement unit.

9. The battery according to claim 8, further comprising a notification unit for outputting a predetermined notice to the electrical apparatus when it is determined by the determination unit that a memory effect occurs.

10. The battery according to claim 8, wherein the determination unit determines whether a memory effect occurs after passage of a predetermined time after discharge is started.

11. The battery according to claim 8, wherein the determination unit determines whether a memory effect occurs in accordance with the relation between current and voltage values when a battery capacity is smaller than a predetermined value.

12. An electrical apparatus, comprising:

an AC adapter for supplying power to the body from an AC power supply;

a secondary battery which is charged by the power supplied from the AC adapter and supplies power to the body by discharge;

a current measurement circuit for measuring a current value currently discharged from the secondary battery;

a voltage measurement circuit for measuring a voltage value currently discharged from the secondary battery;

a memory for storing a specific preset voltage value for a predetermined current value;

a controller for comparing a voltage value measured by the voltage measurement circuit with the specific voltage value stored in the memory while relating a current value measured by the current measurement circuit to the predetermined current value stored in the memory;

and a stop circuit capable of stopping the supply of power from the AC adapter.

13. The electrical apparatus according to claim 12, further comprising: a notification unit for notifying a user of the occurrence of a memory effect in the secondary battery; and an input acceptance unit for accepting a user input indicating a desire to improve the state of the battery indicated by the notification from the notification unit, wherein the stop circuit stops the supply of power from the AC adapter in accordance with an input by the input acceptance unit.

14. An electrical apparatus, comprising:

an AC adapter for supplying power to a body from an AC power supply;

a secondary battery which is charged by the power supplied from the AC adapter for supplying power to the body by discharge;

a stop circuit for stopping the supply of power from the AC adapter; and a controller for controlling the stop circuit, the secondary battery including a current measurement circuit for measuring a currently-discharged current value and a voltage measurement circuit for measuring a currently-discharged voltage value and for outputting a current value measured by the current measurement circuit and a voltage value measured by the voltage measurement circuit to the controller, the controller determining whether a memory effect occurs in accordance with the current value and voltage value output from the secondary battery.

15. The electrical apparatus according to claim 14, wherein the controller has a table showing the relation between current and voltage values corresponding to a battery capacity and determines whether a memory effect occurs in accordance with values stored in the table and output current and voltage values.

16. An electrical apparatus, comprising:

an AC adapter for supplying power to a body from an AC power supply;

a secondary battery that is charged by the power supplied from the AC adapter for supplying power to the body by discharge;

a stop circuit for stopping the supply of power supplied from the AC adapter; and a controller for controlling the stop circuit, the secondary battery including a current measurement circuit for measuring a currently-discharged current value and a voltage measurement circuit for measuring a currently-discharged voltage value, determines whether a memory effect occurs in accordance with a current value measured by the current measurement circuit and a voltage value measured by the voltage measurement circuit, and notifies the controller that the memory effect occurs when the memory effect occurs.

17. An electrical apparatus, comprising: a first power supply line for supplying power supplied from an AC adapter connected to an AC power supply;

a second power supply line for supplying the power supplied from a secondary battery to be charged or discharged;

a current measurement circuit for measuring a current value discharged through the second power supply line;

a voltage measurement circuit for measuring a voltage value currently discharged through the second power supply line;

a controller for determining whether a memory effect occurs in accordance with a current value measured by the current measurement circuit and a voltage value measured by the voltage measurement circuit;

and a stop circuit for stopping the power supplied through the first power supply line when the controller determines that a memory effect occurs and removes the memory effect.

18. A memory effect detection method for detecting a memory effect of a rechargeable secondary battery for supplying power to a body, comprising the steps of:

detecting the capacity of the secondary battery;

measuring a current value discharged from the secondary battery;

measuring a voltage value currently discharged from the secondary battery;

and detecting whether a memory effect occurs in accordance with the relation between measured current and voltage values under a detected battery capacity.

19. The method according to claim 18, wherein a predetermined reference voltage value serves as a criterion of a voltage value to a predetermined current value under a predetermined battery capacity, and a measured voltage value is compared with the reference voltage value to detect the occurrence of a memory effect.

20. The memory-effect detection method according to claim 19, wherein the predetermined battery capacity is kept in a state of 70% or less when assuming the full state as 100%.

21. The memory-effect detection method according to claim 18, detecting whether a memory effect occurs in accordance with a state in which fluctuation of current consumption is small.

* * * * *